United States Patent
Lee et al.

(10) Patent No.: US 7,327,573 B2
(45) Date of Patent: Feb. 5, 2008

(54) HEAT SINK CLIP WITH CAMMED HANDLE

(76) Inventors: Hsieh Kun Lee, 1650 Memorex Dr., Santa Clara, CA (US) 95050; Wellint Xia, 1650 Memorex Dr., Santa Clara, CA (US) 95050; Toly Lee, 1650 Memorex Dr., Santa Clara, CA (US) 95050; Gen-Cai Wang, 1650 Memorex Dr., Santa Clara, CA (US) 95050

( * ) Notice: Subject to any disclaimer, the term of this patent is extended or adjusted under 35 U.S.C. 154(b) by 1020 days.

(21) Appl. No.: 10/627,787

(22) Filed: Jul. 25, 2003

(65) Prior Publication Data
US 2006/0274503 A1    Dec. 7, 2006

(30) Foreign Application Priority Data
Dec. 31, 2002   (TW) .................................. 91221601

(51) Int. Cl.
H05K 7/20    (2006.01)
F28D 15/00   (2006.01)
H01L 23/34   (2006.01)

(52) U.S. Cl. ............... 361/704; 361/710; 165/80.3; 165/185; 257/707; 257/718; 174/16.3

(58) Field of Classification Search ........... 361/704, 361/709–710, 718–719; 165/80.3, 104.33, 165/185; 257/707, 718–719; 248/505, 510; 24/457–458; 174/16.3
See application file for complete search history.

(56) References Cited

U.S. PATENT DOCUMENTS

| 6,058,014 | A  | * | 5/2000 | Choudhury et al. | ........ 361/704 |
| 6,061,239 | A  | * | 5/2000 | Blomquist | ............ 361/704 |
| 6,082,440 | A  | * | 7/2000 | Clemens et al. | ....... 165/80.3 |
| 6,181,559 | B1 | * | 1/2001 | Seo | .................. 361/704 |
| 6,318,452 | B1 | * | 11/2001 | Lee | .................. 165/80.3 |
| 6,392,889 | B1 | * | 5/2002 | Lee et al. | ............ 361/704 |
| 6,421,242 | B1 | * | 7/2002 | Chen | ................ 361/704 |
| 6,462,951 | B2 | * | 10/2002 | Letourneau | ......... 361/704 |
| 6,480,384 | B2 | * | 11/2002 | Lo | ................... 361/704 |
| 6,507,491 | B1 | * | 1/2003 | Chen | ................ 361/697 |
| 6,532,153 | B1 | * | 3/2003 | Chiu | ................ 361/703 |
| 6,563,716 | B1 | * | 5/2003 | Truong et al. | ......... 361/816 |
| 6,639,800 | B1 | * | 10/2003 | Eyman et al. | ......... 361/704 |
| 6,795,317 | B1 | * | 9/2004 | Liu | .................. 361/704 |
| RE38,677  | E  | * | 12/2004 | Blomquist | ............ 361/704 |
| 7,009,843 | B2 | * | 3/2006 | Lee et al. | ............ 361/704 |

FOREIGN PATENT DOCUMENTS

TW              456586         6/2001

* cited by examiner

Primary Examiner—Jayprakash Gandhi
Assistant Examiner—Robert J Hoffberg

(57) ABSTRACT

A heat sink clip (1) includes a main body (10), a post (40), a spring (50) and a cammed handle (30). The main body includes a horizontal portion (12) and two locking arms (16). A locking hole (17) is defined in an end of each locking arm for engaging with catches (82) of a socket (80). The post has a pressing block (44) at a bottom portion and a cutout (42) at a top portion. The spring is placed around the post and rests on the pressing block The post extends through a through aperture (13) of the horizontal portion, and the cutout pivotally receives a cam (32) at one end of the handle. When the handle is pressed, the horizontal portion of the main body is raised by the decompressed spring, so that the locking arms tightly engage with the catches of the socket.

14 Claims, 3 Drawing Sheets

HEAT SINK CLIP WITH CAMMED HANDLE

BACKGROUND OF THE INVENTION

1. Field of the Invention

The present invention relates to securing of heat sinks to electronic packages, and particularly to a heat sink clip having a cammed handle for securely and readily retaining a heat sink to an electronic package.

2. Related Art

In order to reduce heat produced by high-powered computer Central Processing Units (CPUs) such as the Pentium IV produced by Intel(R) and the K8 produced by AMD(R), bigger and heavier heat sinks are becoming increasingly necessary. Strong resilient clips are often used to attach these heat sinks onto electronic packages.

An example of this kind of heat sink clip is disclosed in Taiwan patent publication No. 456586. The clip is usually integrally formed from a sheet of plastic or steel. The clip comprises a central pressing portion, and two resilient portions extending outwardly and upwardly from opposite sides of the pressing portion. Two locking portions depend from distal ends of the pressing portion, respectively. A locking hole is defined in each of the locking portions. The clip is relatively rigid, and an operator must exert considerable force to press the resilient portion, which is cumbersome and time-consuming. Furthermore, a tool must be used to detach the clip from a corresponding CPU socket. It is inconvenient to use a tool, especially within the limited confines of a typical computer case. This slows down the process of attachment and detachment of the heat sink to and from the CPU, and results in inefficiency in mass production facilities. Furthermore, the tool can easily skid off the clip during such attachment or detachment, causing damage to adjacent components in the computer system.

Thus, an improved heat sink clip which overcomes the above-mentioned problems is desired.

BRIEF SUMMARY OF THE INVENTION

Accordingly, an object of the present invention is to provide a heat sink clip having a camming mechanism for readily and securely attaching a heat sink to an electronic package, and for readily detaching the heat sink therefrom.

Another object of the present invention is to provide a clip assembly having a camming mechanism for facilitating manual operation thereof.

To achieve the above-mentioned objects, a heat sink clip of the present invention for attaching a heat sink to a CPU mounted on a socket comprises a main body, a post, a spring and a cammed handle. The main body comprises a horizontal portion, and two locking arms depending from the horizontal portion. A locking hole is defined in an end of each locking arm for engaging with catches of a socket. The post has a pressing block at a bottom portion and a cutout at a top portion. The spring is placed around the post and rests on the pressing block. The post extends through a through aperture of the horizontal portion, and the cutout pivotally receives a cam at one end of the cammed handle. When the handle is pressed, the horizontal portion of the main body is raised by the decompressed spring, so that the locking arms tightly engage with the catches of the socket.

Other objects, advantages and novel features of the present invention will be drawn from the following detailed description of a preferred embodiment of the present invention together with the attached drawings, in which:

DESCRIPTION OF THE PREFERRED EMBODIMENT

Figure 1:
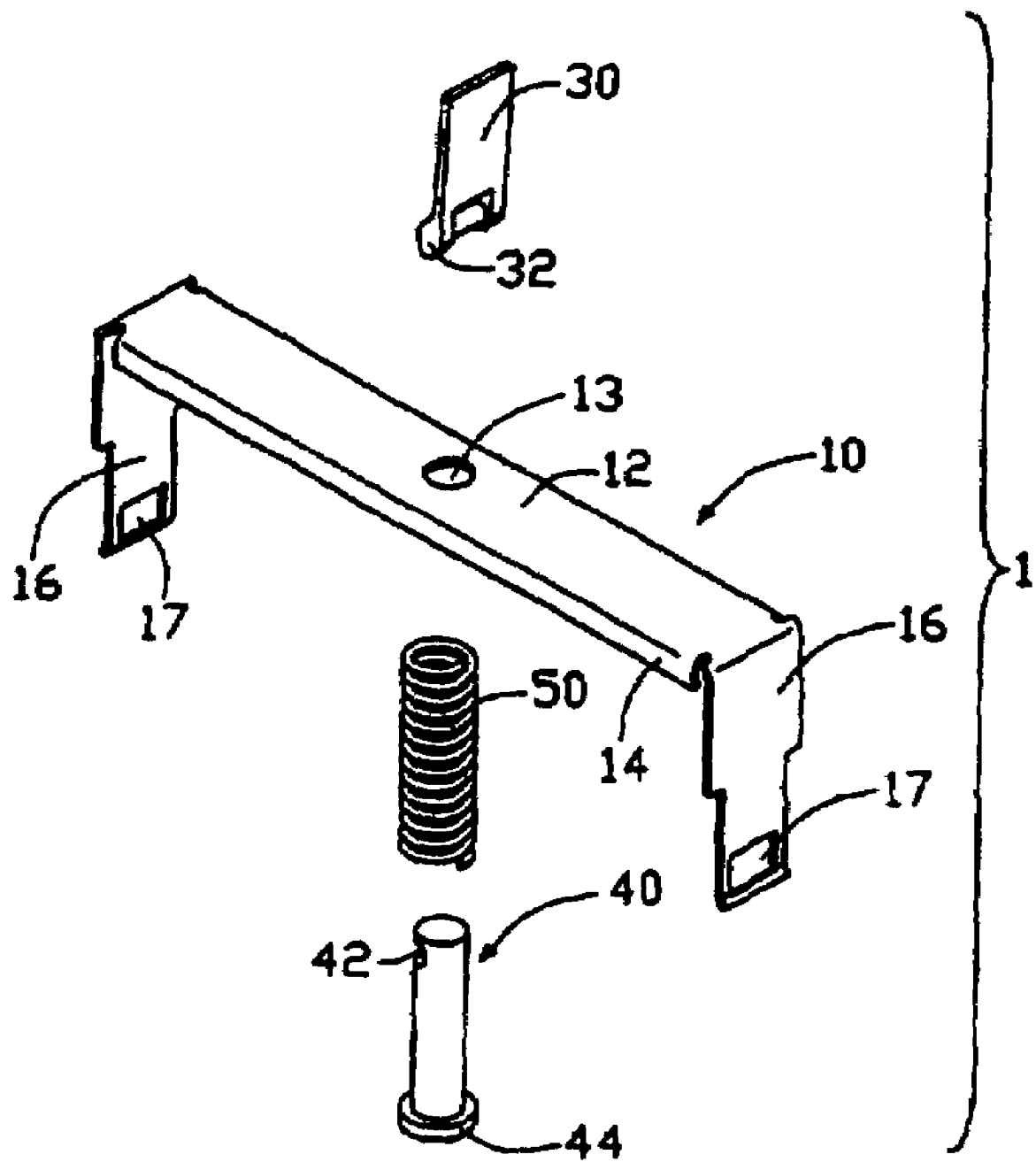
FIG. 1 is an exploded, isometric view of a heat sink clip in accordance with the present invention.
Figure 2:
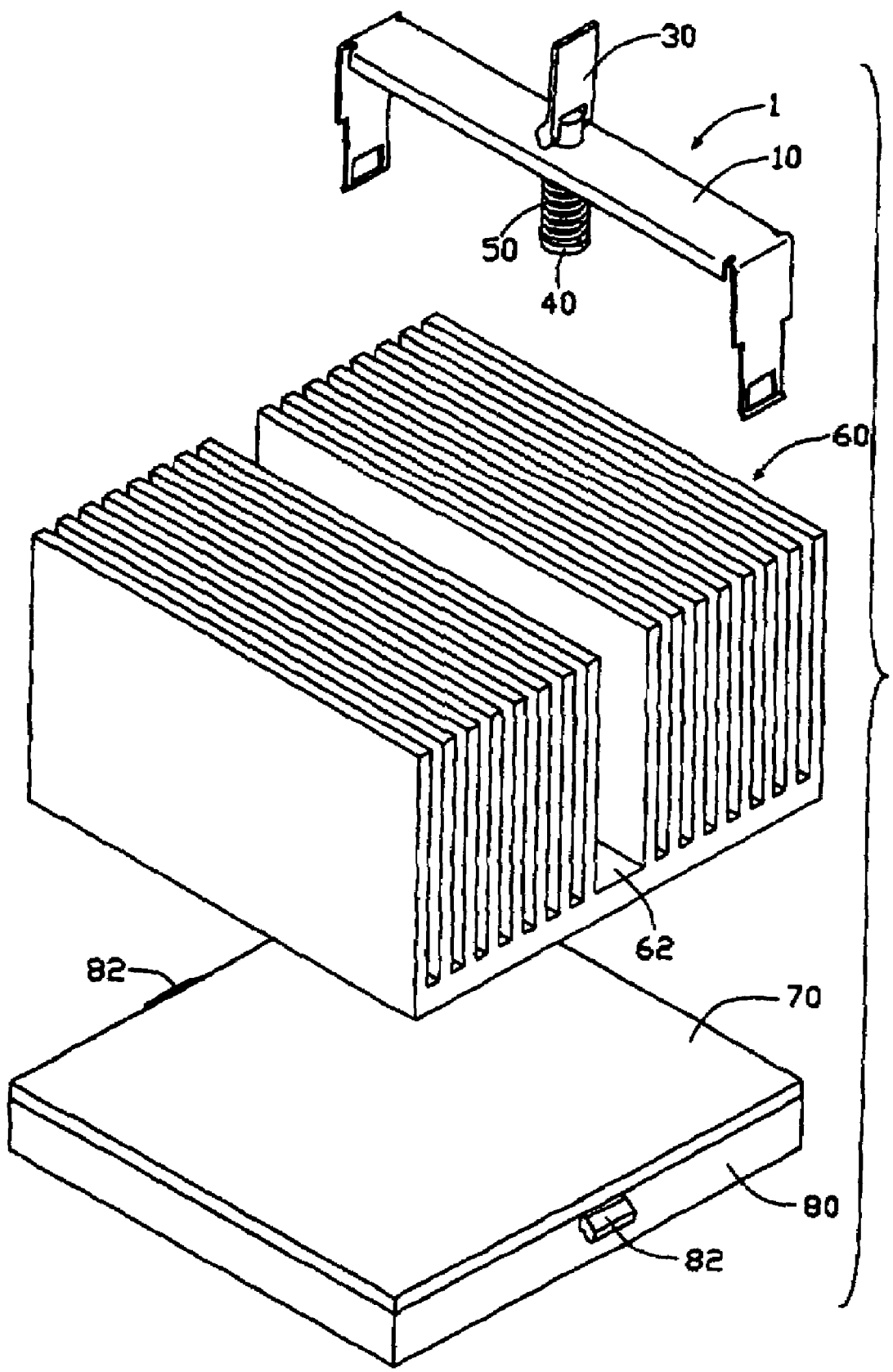
FIG. 2 is an exploded, isometric view of the heat sink clip of FIG. 1 fully assembled, together with a heat sink, and a central processing unit (CPU) mounted on a printed circuit board (PCB)

Referring to FIGS. 1 and 2, a heat sink clip 1 in accordance with the present invention is used to press a heat sink 60 onto a CPU 70 mounted on a socket 80. The heat sink clip 1 comprises a main body 10, a handle 30, a post 40, and a spring 50.

The main body 10 comprises a horizontal portion 12, and two locking arms 16 depending from opposite ends of the horizontal portion 12 respectively. Two reinforcing flanges 14 are bent downwardly from opposite long sides of the horizontal portion 12. A through aperture 13 is defined in a middle of the horizontal portion 12. A locking hole 17 is defined in a free end of each locking arm 16.

One end of the handle 30 has a cam 32. A cutout 42 is defined in a top portion of the post 40, for pivotally receiving a central pivot portion of the cam 32. A pressing block 44 is formed at a bottom end of the post 40. A diameter of the pressing block 44 is greater than that of a main shaft of the post 40, and greater than that of the spring 50. A diameter of the through aperture 13 of the main body 10 is slightly greater than that of the main shaft of the post 40, and less than that of the spring 50.

The heat sink 60 defines a channel 62 in a middle thereof. The socket 80 forms two catches 82 at opposite sides thereof respectively, corresponding to opposite ends of the channel 62 of the heat sink 60.

In assembling the heat sink clip 1, the spring 50 is placed around the post 40, and seated on the pressing block 44 of the post 40. The post 40 is then extended upwardly into the through aperture 13 of the main body 10, until the top portion of the post 40 protrudes beyond the main body 10. The cutout 42 of the post 40 engagingly receives the pivot portion of the cam 32, so that the handle 30 is pivotally connected with the post 40. The handle 30 is oriented in a vertical position, which raises the post 40 relative to the main body 10 and causes the spring 50 to be compressed.

Figure 3:
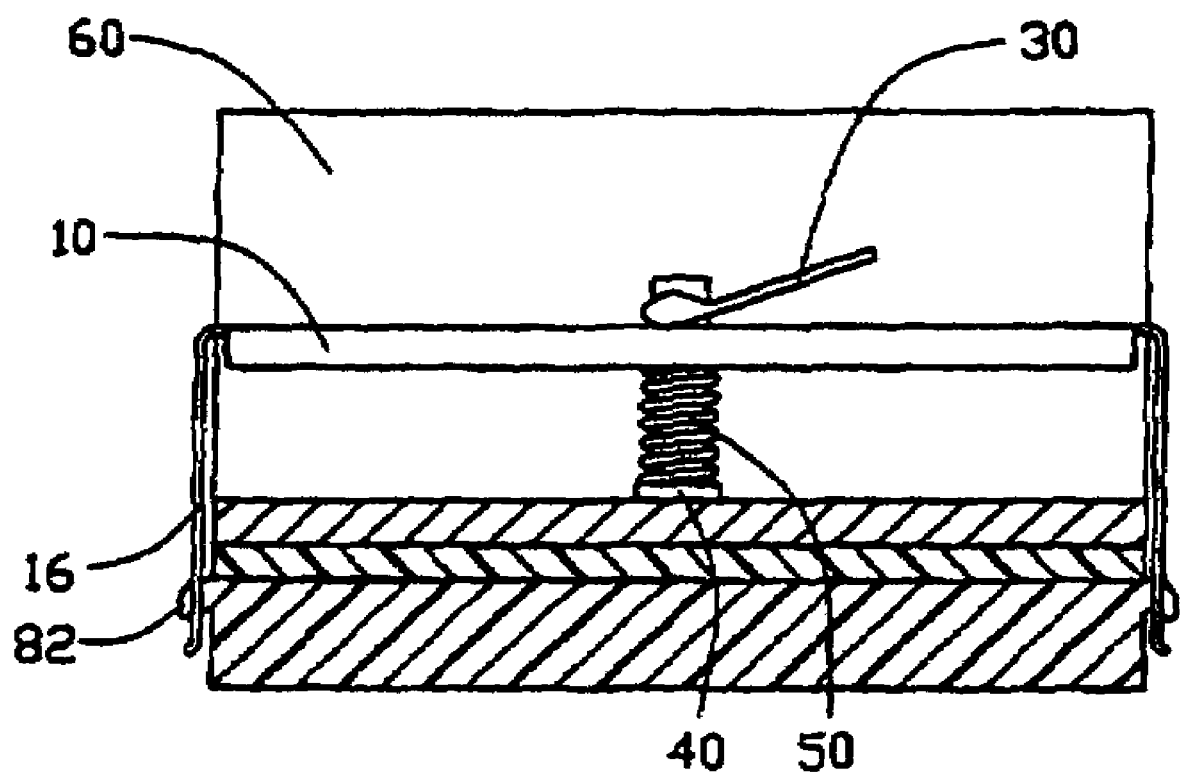
FIG. 3 is a side elevation assembled view of FIG. 2, with the CPU, the PCB and part of the heat sink shown in cross-section.

Referring also to FIG. 3, in operation, the heat sink 60 is placed on the CPU 70. The heat sink clip 1 is placed in the channel 62 of the heat sink 60. The pressing block 44 of the post 40 loosely rests on a top surface of a base of the heat sink 60 in the channel 62, and the locking holes 17 of the locking arms 16 loosely receive the catches 82 of the socket 80. The handle 30 is then rotated downwardly. A distance between the pivot portion of the cam 32 and the horizontal portion 12 of the main body 10 is reduced, so that the spring 50 is decompressed and urges the main body 10 upwardly. The locking arms 16 of the main body 10 thus resiliently engage with undersides of the catches 82 of the socket 80. In addition, the decompression of the spring urges the pressing block 44 to press the heat sink 60 against the CPU 70. The heat sink 60 is thereby secured to the CPU 70.

In disassembly of the clip 1 from the socket 80, the handle 30 is rotated upwardly, so that the main body 10 is depressed by the cam 32. The spring 50 is compressed. The locking arms 16 return to the position where they are loosely engaged over the catches 82 of the socket 80. The clip 1 is then easily taken out from the heat sink 60.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat sink clip for attaching a heat sink to an electronic package that is mounted on a socket, the heat sink clip comprising:
   a main body comprising a longitudinal portion and two locking arms depending from the longitudinal portion, the longitudinal portion defining a through aperture therein, each of the locking arms having engaging means adapted to engage with the socket;
   a post extending through the through aperture of the main body, the post having a pressing portion at a bottom thereof, a resilient element being seated between the pressing portion and the longitudinal portion of the main body; and
   a handle pivotally connected to an upper portion of the post, the handle having a cam at one end abutting a top of the longitudinal portion; wherein
   when the handle is generally perpendicular to the longitudinal portion, the locking arms are at a lowest position, and when the handle is pivoted down to the longitudinal portion, the locking arms are in a highest position in which the clip can secure the heat sink to the electronic package.

2. The heat sink clip as described in claim 1, wherein opposite long side edges of the longitudinal portion are bent downwardly, for reinforcing the main body.

3. The heat sink clip as described in claim 1, wherein a cutout is defined in an upper portion of the post, for pivotally receiving a pivot portion of the cam.

4. The heat sink clip as described in claim 1, wherein a diameter of the pressing portion is greater than that of a main shaft of the post, and is also greater than that of the resilient element.

5. The heat sink clip as described in claim 4, wherein a diameter of the through aperture is slightly greater than that of the main shaft of the post, and less than that of the resilient element.

6. The heat sink clip as described in claim 1, wherein the engaging means of each of the locking arms is a locking hole.

7. The heat sink clip as described in claim 1, wherein the resilient element is a coil spring.

8. A heat sink assembly comprising:
   a heat sink;
   a support module having first engaging means;
   a clip adapted to attach the heat sink onto an electronic package, the clip comprising a main body, a post, a resilient element, and a handle, the main body comprising a longitudinal portion and two locking arms depending from the longitudinal portion, the longitudinal portion defining a through aperture, each of the locking arms defining second engaging means to engage with the first engaging means of the support module, the post extending through the through aperture of the longitudinal portion and having a top portion and a bottom portion respectively located at upper and lower sides of the longitudinal portion, wherein the resilient element is disposed around the post below the longitudinal portion, the handle has a cam end, and the cam end is pivotally connected to the top portion of the post.

9. The heat sink assembly as described in claim 8, wherein a reinforcing flange is formed from each of opposite long sides of the longitudinal portion.

10. The heat sink assembly as described in claim 8, wherein a cutout is defined in the top portion of the post, the cutout pivotally receiving a pivot portion of the cam end of the handle.

11. The heat sink assembly as described in claim 8, wherein the bottom of the post has a pressing block, and the resilient element abuts the pressing block.

12. The heat sink assembly as described in claim 8, wherein the first and second engaging means respectively comprises catches and locking holes.

13. The heat sink assembly as described in claim 8, wherein the resilient element is a coil spring.

14. A heat sink assembly comprising:
   a heat sink defining a slot;
   a heat generating device which the heat sink is seated upon;
   a module located under the heat generating device with locking devices thereon;
   a clip including:
   a longitudinal portion disposed in the slot with two opposite locking arms respectively located at two opposite ends and latchably engaged with the corresponding locking devices;
   a post located on the longitudinal portion and vertically moveable relative thereto; wherein said post is equipped with a camming handle to lift the post relative to the longitudinal portion by rotation; and
   a spring including a first section abutting against the longitudinal portion and a second section abutting against a lower end of the post; wherein
   said spring is in a first compression status with the lower end of the post downwardly pressing against the heat sink for securing the heat sink to the module, while is in a second compression status with the lower end of the post upwardly spaced from the heat sink for releasing the heat sink from the module, said second compression status being greater than said first compression status.

* * * * *